(12) United States Patent
Huang (10) Patent No.: US 7,190,144 B2
(45) Date of Patent: Mar. 13, 2007

(54) SYSTEM AND METHOD FOR ADJUSTING A PID CONTROLLER IN A LIMITED ROTATION MOTOR SYSTEM

(75) Inventor: Yuhong Huang, Acton, MA (US)

(73) Assignee: GSI Group Corporation, Billerica, MA (US)

( * ) Notice: Subject to any disclaimer, the term of this patent is extended or adjusted under 35 U.S.C. 154(b) by 17 days.

(21) Appl. No.: 11/040,230

(22) Filed: Jan. 21, 2005

(65) Prior Publication Data
US 2005/0162174 A1 Jul. 28, 2005

Related U.S. Application Data (60) Provisional application No. 60/538,842, filed on Jan. 23, 2004, provisional application No. 60/575,255, filed on May 28, 2004, provisional application No. 60/613,962, filed on Sep. 28, 2004.

(51) Int. Cl.
G05B 11/42 (2006.01)
G05B 19/29 (2006.01)
G05B 11/01 (2006.01)
G05B 21/02 (2006.01)

(52) U.S. Cl. .............. 318/610; 318/600; 318/629; 318/636; 318/568.2; 318/727; 388/815

(58) Field of Classification Search ............ 359/198; 318/609, 610, 629, 636, 632, 638, 625, 560, 318/163, 600, 601, 538, 343, 437, 568.11, 318/568.19, 568.2, 727; 388/815, 902; 324/520, 324/76.21
See application file for complete search history.

(56) References Cited

U.S. PATENT DOCUMENTS 3,932,794 A 1/1976 Iwako
3,999,043 A 12/1976 Reiss et al.
4,151,567 A 4/1979 Dorsemagen et al.

(Continued)

FOREIGN PATENT DOCUMENTS

CA 2359739 4/2003

(Continued)

OTHER PUBLICATIONS

Datasheets for Copley Controls Corp., 2002 (4 pages).
"Digital Servoamplifier Upgrades Brush Motor Drive Systems," Copley Controls Corp., New Product Release dated Apr. 28, 2002, pp. 1-7.

(Continued)

Primary Examiner—Loha Ben
(74) Attorney, Agent, or Firm—Gauthier & Connors, LLP (57) ABSTRACT

An adjustment system is disclosed for adjusting a proportional, integral, derivative controller in a limited rotation motor system. The adjustment system includes a first transform unit, a second transform unit, a model identification unit, and a PID adjustment unit. The first transform unit is for receiving a first digital signal that is representative of a motor control signal, and is for providing a first frequency domain sequence that is representative of a frequency domain representation of the motor control signal. The second transform unit is for receiving a second digital signal that is representative of a position detection signal, and is for providing a second frequency domain sequence that is representative of a frequency domain representation of the position detection signal. The model identification unit is for identifying a representation of a ratio of the first and second frequency domain sequences. The PID adjustment unit is for identifying appropriate values for the coefficient $k_p$ of a proportional unit of the system, for the coefficient $k_i$ of an integral unit for the system, and for the coefficient $k_d$ of a derivative unit for the system.

20 Claims, 11 Drawing Sheets

U.S. PATENT DOCUMENTS

| | | | |
|---|---|---|---|
| 4,282,468 A | 8/1981 | Barker et al. | |
| 4,398,241 A | 8/1983 | Baker et al. | |
| 4,514,671 A | 4/1985 | Louth | |
| 4,532,402 A | 7/1985 | Overbeck | |
| 4,536,906 A | 8/1985 | Varndell et al. | |
| 4,624,368 A | 11/1986 | Satake | |
| 4,631,605 A | 12/1986 | O'Gwynn | |
| 4,646,280 A | 2/1987 | Toyosawa | |
| 4,670,653 A | 6/1987 | McConkle et al. | |
| 4,809,253 A | 2/1989 | Baas et al. | |
| 4,845,698 A | 7/1989 | Baas | |
| 4,855,674 A | 8/1989 | Murate et al. | |
| 4,864,295 A | 9/1989 | Rohr | |
| 4,870,631 A | 9/1989 | Stoddard | |
| 4,893,068 A | 1/1990 | Evans, Jr. | |
| 4,903,131 A | 2/1990 | Lingemann et al. | |
| 4,930,027 A | 5/1990 | Steele et al. | |
| 4,956,831 A | 9/1990 | Sarraf et al. | |
| 4,961,117 A | 10/1990 | Rumley | |
| 4,965,513 A | 10/1990 | Haynes et al. | 324/772 |
| 4,972,344 A | 11/1990 | Stoddard et al. | |
| 5,075,875 A | 12/1991 | Love et al. | |
| 5,093,608 A | 3/1992 | Kono et al. | |
| 5,119,213 A | 6/1992 | Graves et al. | |
| 5,122,720 A | 6/1992 | Martinson et al. | |
| 5,167,002 A * | 11/1992 | Fridhandler | 388/815 |
| 5,185,676 A | 2/1993 | Nishiberi | |
| 5,187,364 A | 2/1993 | Blais | |
| 5,225,770 A | 7/1993 | Montagu | |
| 5,229,574 A | 7/1993 | Stone | |
| 5,245,528 A | 9/1993 | Saito et al. | |
| 5,257,041 A | 10/1993 | Kresock et al. | |
| 5,275,041 A | 1/1994 | Poulsen | |
| 5,280,377 A | 1/1994 | Chandler et al. | |
| 5,285,378 A | 2/1994 | Matsumoto | |
| 5,293,102 A | 3/1994 | Martinson et al. | |
| 5,313,147 A | 5/1994 | Yoneda et al. | |
| 5,331,264 A | 7/1994 | Cheng et al. | |
| 5,375,186 A | 12/1994 | Schuettpelz | |
| 5,406,496 A | 4/1995 | Quinn | |
| 5,424,526 A | 6/1995 | Leonhardt et al. | |
| 5,424,632 A | 6/1995 | Montagu | |
| 5,452,285 A | 9/1995 | Monen | |
| 5,453,618 A | 9/1995 | Sutton et al. | |
| 5,534,071 A | 7/1996 | Varshney et al. | |
| 5,537,109 A | 7/1996 | Dowd | |
| 5,541,486 A | 7/1996 | Zoller et al. | |
| 5,568,377 A | 10/1996 | Seem et al. | |
| 5,585,976 A | 12/1996 | Pham | |
| 5,589,870 A | 12/1996 | Curry et al. | |
| 5,600,121 A | 2/1997 | Kahn et al. | |
| 5,604,516 A | 2/1997 | Herrod et al. | |
| 5,610,487 A * | 3/1997 | Hutsell | 318/560 |
| 5,646,765 A | 7/1997 | Laakmann et al. | |
| 5,653,900 A | 8/1997 | Clement et al. | |
| 5,656,908 A * | 8/1997 | Rehm | 318/608 |
| 5,699,494 A | 12/1997 | Colbert et al. | |
| 5,726,883 A | 3/1998 | Levine et al. | |
| 5,742,503 A | 4/1998 | Yu | |
| 5,767,494 A | 6/1998 | Matsueda et al. | |
| 5,801,371 A | 9/1998 | Kahn et al. | |
| 5,805,448 A | 9/1998 | Lindsay et al. | |
| 5,808,725 A | 9/1998 | Moberg et al. | |
| 5,859,774 A | 1/1999 | Kuzuya et al. | |
| 5,869,945 A * | 2/1999 | Ha et al. | 318/600 |
| 5,886,335 A | 3/1999 | Matsueda | |
| 5,886,422 A | 3/1999 | Mills | |
| 5,912,541 A | 6/1999 | Bigler et al. | |
| 5,914,924 A | 6/1999 | Takagi et al. | |
| 5,986,989 A | 11/1999 | Takagi et al. | |
| 6,054,828 A | 4/2000 | Hill | |
| 6,072,653 A | 6/2000 | Goker | |
| 6,081,751 A | 6/2000 | Luo et al. | |
| 6,107,600 A | 8/2000 | Kurosawa | |
| 6,144,011 A | 11/2000 | Moss et al. | |
| 6,198,176 B1 * | 3/2001 | Gillette | 307/64 |
| 6,198,246 B1 | 3/2001 | Yutkowitz | |
| 6,211,484 B1 | 4/2001 | Kaplan et al. | |
| 6,211,639 B1 | 4/2001 | Meister et al. | |
| 6,211,640 B1 * | 4/2001 | Fujisaki et al. | 318/636 |
| 6,243,350 B1 | 6/2001 | Knight et al. | |
| 6,256,121 B1 | 7/2001 | Lizotte et al. | |
| 6,275,319 B1 | 8/2001 | Gadhok | |
| 6,304,359 B1 | 10/2001 | Gadhok | |
| 6,317,637 B1 | 11/2001 | Limroth | |
| 6,350,239 B1 | 2/2002 | Ohad et al. | |
| 6,353,766 B1 | 3/2002 | Weinzierl | |
| 6,424,873 B1 | 7/2002 | Przybylski | |
| 6,442,444 B2 | 8/2002 | Matsubara et al. | |
| 6,445,962 B1 | 9/2002 | Blevins et al. | |
| 6,449,564 B1 | 9/2002 | Kliman et al. | |
| 6,453,722 B1 | 9/2002 | Liu et al. | |
| 6,463,352 B1 | 10/2002 | Tadokoro et al. | |
| 6,510,353 B1 | 1/2003 | Gudaz et al. | |
| 6,577,907 B1 | 6/2003 | Czyszczewski et al. | |
| 6,622,099 B2 | 9/2003 | Cohen et al. | |
| 6,643,080 B1 | 11/2003 | Goodner, III et al. | |
| 6,646,397 B1 | 11/2003 | Discenzo | |
| 6,697,685 B1 | 2/2004 | Caldwell | |
| 6,721,445 B1 | 4/2004 | Azencott | |
| 6,774,601 B2 | 8/2004 | Schwartz et al. | |
| 6,782,296 B2 | 8/2004 | Hoche | |
| 6,812,668 B2 | 11/2004 | Akiyama | |
| 6,822,415 B1 * | 11/2004 | Komiya et al. | 318/629 |
| 6,826,519 B1 | 11/2004 | Fujino | |
| 6,853,951 B2 | 2/2005 | Jarrell et al. | |
| 6,876,167 B1 * | 4/2005 | Jones | 318/461 |
| 6,885,972 B2 | 4/2005 | Samata et al. | |
| 6,895,352 B2 | 5/2005 | Josselson et al. | |
| 6,937,908 B2 | 8/2005 | Chang et al. | |
| 7,039,557 B2 | 5/2006 | Mayer et al. | 702/184 |
| 2001/0011550 A1 | 8/2001 | Zheng | |
| 2002/0049513 A1 | 4/2002 | Nussbaum et al. | |
| 2003/0097193 A1 | 5/2003 | Makino et al. | |
| 2003/0128240 A1 | 7/2003 | Martinez et al. | |
| 2003/0163296 A1 | 8/2003 | Richards | |
| 2004/0135534 A1 | 7/2004 | Cullen | |
| 2005/0174124 A1 * | 8/2005 | Huang | 324/520 |
| 2005/0228512 A1 | 10/2005 | Chen et al. | |
| 2005/0251271 A1 | 11/2005 | Cutler | |

FOREIGN PATENT DOCUMENTS

| | | |
|---|---|---|
| DE | 2629473 | 4/1979 |
| DE | 3505681 | 8/1985 |
| DE | 3520189 | 12/1986 |
| DE | 4211213 | 10/1993 |
| EP | 0260138 | 3/1988 |
| EP | 0378093 | 7/1990 |
| EP | 0339402 | 6/1993 |
| EP | 896265 | 7/1998 |
| EP | 1283593 | 2/2003 |
| EP | 1298511 | 4/2003 |
| FR | 2600789 | 12/1987 |
| GB | 951785 | 3/1964 |
| JP | 63190584 | 8/1988 |
| JP | 01224189 | 9/1989 |
| JP | 04229088 | 8/1992 |
| JP | 05036851 | 2/1993 |
| JP | 07114402 | 5/1995 |
| JP | 2000028955 | 1/2000 |
| JP | 2000-330641 | 11/2000 |
| JP | 2001142917 | 5/2001 |
| JP | 2001-245488 | 9/2001 |

| JP | 2002199147 | 7/2002 |
| JP | 2003044111 | 2/2003 |
| WO | WO93/18525 | 9/1993 |
| WO | WO09917282 | 4/1999 |
| WO | WO01/33303 | 5/2001 |
| WO | WO01/64591 | 9/2001 |
| WO | WO03/097290 | 11/2003 |

OTHER PUBLICATIONS

Y. Tzou, "Auto-tuning Control of Self-Commissioning Electric Drives," Power Electronics and Mechatronics Control Lab., Dept. of Electrical & Control Engineering, National Chiao Tung Univ., Taiwan, pp. 483-487.

Opposition Communication dated Jan. 3, 2006 and translation of pending claims in opposition proceeding regarding EP 896265.

Levy, G.F.: "Numeric Activex Components" Software Practice & Experience, John Wiley & Sons, Ltd, Chichester, GB, vol. 31, No. 2, Feb. 2001, p. 147-189.

Huang GQ et al.: "Web-based product and process data modeling in concurrent 'design for X'" Robotics and Computer Integrated Manufacturing, Pergamon Press, Oxford, GB, vol. 15, No. 1, Feb. 1999, p. 53-63.

B.A. Brandin, "A digital approach to the disturbance-accommodation problem," Transactions of the Institute of Measurement and Control, vol. 10, No. 5, Oct. 1988, London, UK, pp. 273-280.

C.C. Hang et al., "On-Line Auto Tuning of PID Controllers Based on the Cross-Correlation Technique," IEEE Transactions on Industrial Electronics, vol. 38, No. 6, Dec. 1991, New York, US, pp. 428-437.

C.C. Hang et al., "Development of An Intelligent Self-Tuning PID Controller," Advances in Instrumentation and Control, vol. 47, No. 2, Jan. 1992, Research Triangle Park, US, pp. 1101-1111.

Scanlab, Smart Scanning-inteliScan 10, Aug. 2003, SCANLAB America, Inc., Cincinnati, Ohio.

Lasesys Corporation, Series LBS-6000 Galvanometric Scanners, Feb. 6, 2004, http:www.lasesys.com/galvanometric.html.

Phototonics Spectra, Cambridge Technology Inc. Digital Control Center DC900, Jul. 2003, http://www.photonics.com/spectra/minimag/XQ/ASP/minimagid.70/QX/read.htm.

Birou et al., "Real-time robot drive control with PM-synchronous motors using a DSP-based computer system," Power Electronics and Motion Control Conference, 2000. Proceedings. PIEMC 2000. The Third International Aug. 15-18, 2000, Piscataway, NJ, USA, IEEE, vol. 3, Aug. 15, 2000, pp. 1290-1295.

Y.H. Huang et al., "Autotuning of a servowriter head positioning system with minimum positioning error," J. Applied Physics, vol. 79, No. 8, Apr. 1996.

* cited by examiner

SYSTEM AND METHOD FOR ADJUSTING A PID CONTROLLER IN A LIMITED ROTATION MOTOR SYSTEM

The present application claims priority to U.S. Provisional Patent Application Ser. No. 60/538,842 filed Jan. 23, 2004, and claims priority to U.S. Provisional Patent Application Ser. No. 60/575,255 filed May 28, 2004, and claims priority to U.S. Provisional Patent Application Ser. No. 60/613,962 filed Sep. 28, 2004.

BACKGROUND

The present invention generally relates to limited rotation motor systems, and relates in particular to systems and methods for designing and adjusting limited rotation motor systems.

Limited rotation motors generally include stepper motors and constant velocity motors. Certain stepper motors are well suited for applications requiring high speed and high duty cycle sawtooth scanning at large scan angles. For example, U.S. Pat. No. 6,275,319 discloses an optical scanning device for raster scanning applications.

Limited rotation motors for certain applications, however, require the rotor to move between two positions with a precise and constant velocity rather than by stepping and settling in a sawtooth fashion. Such applications require that the time needed to reach the constant velocity be as short as possible and that the amount of error in the achieved velocity be as small as possible. Constant velocity motors generally provide a higher torque constant and typically include a rotor and drive circuitry for causing the rotor to rotate about a central axis, as well as a position transducer, e.g., a tachometer or a position sensor, and a feedback circuit coupled to the transducer that permits the rotor to be driven by the drive circuitry responsive to an input signal and a feedback signal. For example, U.S. Pat. No. 5,424,632 discloses a conventional two-pole limited rotation motor.

A requirement of a desired limited rotation motor for certain applications is a system that is capable of changing the angular position of a load such as a mirror from angle A to angle B, with angles A and B both within the range of angular motion of the scanner, and both defined arbitrarily precisely, in an arbitrarily short time while maintaining a desired linearity of velocity within an arbitrarily small error. Both the minimum time of response of this system and the minimum velocity error are dominated by the effective bandwidth of the system. The effective bandwidth of the system, however, is governed by many factors, including the open loop gain of the system.

A limited rotation torque motor may be modeled or represented by a double-integrator model plus several flexible modes and low frequency non-linear effects. A typical closed-loop servo system for a galvanometer includes integral actions for low frequency uncertainties and a notch filter for high frequency resonant modes. System operation is chosen at the mid-frequency range where the system is well modeled by the rigid body. For a double integrator rigid body model, there is a direct relationship between the open-loop gain and the cross-over frequency on the frequency response plot. For example, an automatic tuning system for a servowriter head positioning system is disclosed in *Autotuning of a servowriter head positioning system with minimum positioning error*, Y. H. Huang, S. Weerasooriya and T. S. Low, J. Applied Physics, v. 79 pp. 5674–5676 (1996).

Figure 1:
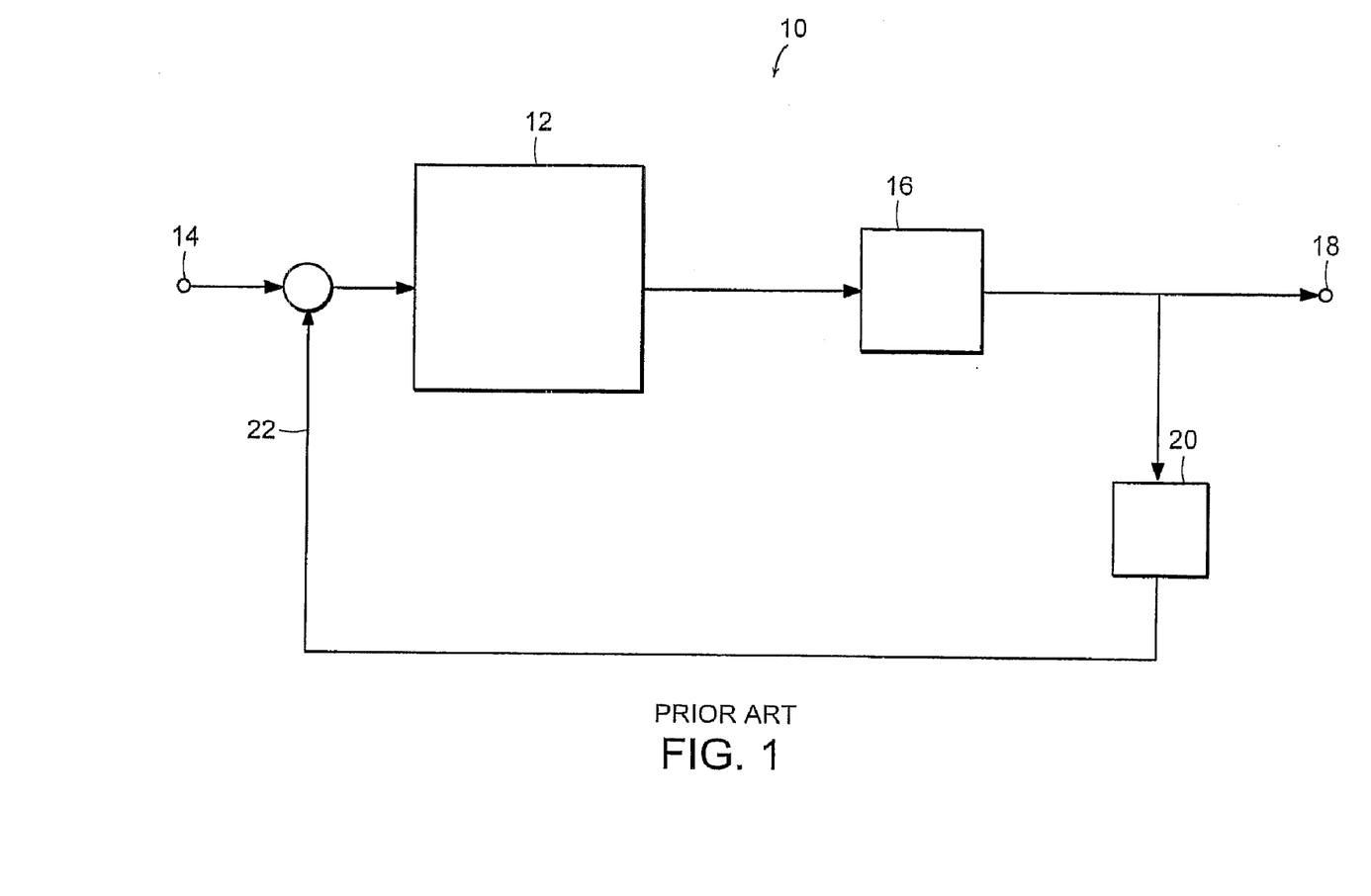
FIG. 1 shows an illustrative diagrammatic functional view of a limited rotation motor and control system in accordance with the prior art.

FIG. 1 shows a model of a limited rotation torque motor system 10 of the prior art. The system 10 includes a controller 12 (e.g., a position, integral, derivative or PID controller) that receives an input command 14. The controller 12 provides a control signal to a motor 16, which moves an optical element such as a mirror to provide position changes 18 responsive to the input command 14. The system also includes a position detector 20 that provides a position detection signal 22 that is also provided to the controller 12 with the input command 14. Open-loop gain (or 0 dB cross-over variations) of the system affects closed-loop system performance if the controller is not adaptive to these variations.

In the limited rotation motor actuator, the open-loop gain is determined by the torque constant of the motor, the inertia of the mirror and rotor structure, and the gain characteristics of the power amplifier. The torque constant may change with the operation temperature. For example, the magnetic material used in the motor may have temperature coefficients of between about 0.1% C and 1% C. With a temperature change of 20 C, the resulting change in torque constant may be non-negligible. The torque constant also changes with the angle of operations. There are other factors that may affect the torque constant as well as the imperfect coil winding, which causes changes in the field density (see for example, U.S. Pat. No. 5,225,770).

The change of head from one size to another size may also cause significant changes in total inertia, and consequently the open-loop gain. Adaptive filter adjustment of open-loop gain variations due to change in mirrors is more desirable when human intervention is not required at initial set up. Other factors that may contribute to open-loop gain variations are temperature dependence of the power amplifier and changes in power amplifier circuits due to aging.

Such limited rotation motors may be used, for example, in a variety of laser scanning applications, such as high speed surface metrology. Further laser processing applications include laser welding (for example high speed spot welding), surface treatment, cutting, drilling, marking, trimming, laser repair, rapid prototyping, forming microstructures, or forming dense arrays of nanostructures on various materials.

The processing speeds of such systems are typically limited by one of more of mirror speed, X-Y stage speed, material interaction and material thermal time constants, the layout of target material and regions to be processed, and software performance. Generally, in applications where one or more of mirror speed, position accuracy, and settling time are factors that limit performance, any significant improvement in scanning system open loop gain may translate into immediate throughput improvements.

There is a need, therefore, for an improved limited rotation motor system, and more particularly, there is a need for a rotor for a limited rotation motor system that provides maximum performance.

SUMMARY

In accordance with an embodiment, the invention provides an adjustment system for adjusting a proportional, integral, derivative controller in a limited rotation motor system. The adjustment system includes a first transform unit, a second transform unit, a model identification unit, and a PID adjustment unit. The first transform unit is for receiving a first digital signal that is representative of a motor control signal, and is for providing a first frequency domain sequence that is representative of a frequency domain representation of the motor control signal. The second transform unit is for receiving a second digital signal that is representative of a position detection signal, and is for providing a second frequency domain sequence that is representative of a frequency domain representation of the position detection signal. The model identification unit is for identifying a representation of a ratio of the first and second frequency domain sequences. The PID adjustment unit is for identifying appropriate values for the coefficient $k_p$ of a proportional unit of the system, for the coefficient $k_i$ of an integral unit for the system, and for the coefficient $k_d$ of a derivative unit for the system.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

In accordance with various embodiments of the invention, limited rotation motor performance data is captured from a motor system. A pseudo random binary signal is input to the system. The signal that is input to the motor (the motor input signal) is recorded, and the position signal that is received from the position detector (the PD signal) is also recorded. A Fast Fourier Transform (FFT) is performed on each signal, and a frequency response representation for the PD signal is compared to the frequency response representation for the motor input signal by taking the ratio of these two representations. The ratio provides a sequence (the ratio sequence) that represents the open loop frequency response for the system. The open loop frequency response may be provided in a Bode plot of the magnitude versus frequency. A mathematical system model may then be generated that represents the transfer function of the motor system. Knowing the mathematical model for a motor system permits the system to be designed to provide optimal output, e.g., by adjusting the PID coefficients to achieve optimal performance, or by designing a controller that best complements the motor system transfer function to achieve optimal performance.

The system provides that the identification of the open loop cross over frequency variations in the motor system may be identified automatically (even via a remote digital network) as a result of changes in mirror inertia, operating temperature and operation angle. The automatic identification may be performed closed-loop so that system stability is not affected during the procedure. A data collection procedure may be performed in milliseconds.

An automatic identification system in accordance with an embodiment of the invention may involve system excitation using a pseudo random binary sequence (PRBS), then conducting a Fast Fourier Transform (FFT) on the captured time responses. The system identification is then modeled using the FFT data.

Figure 2:
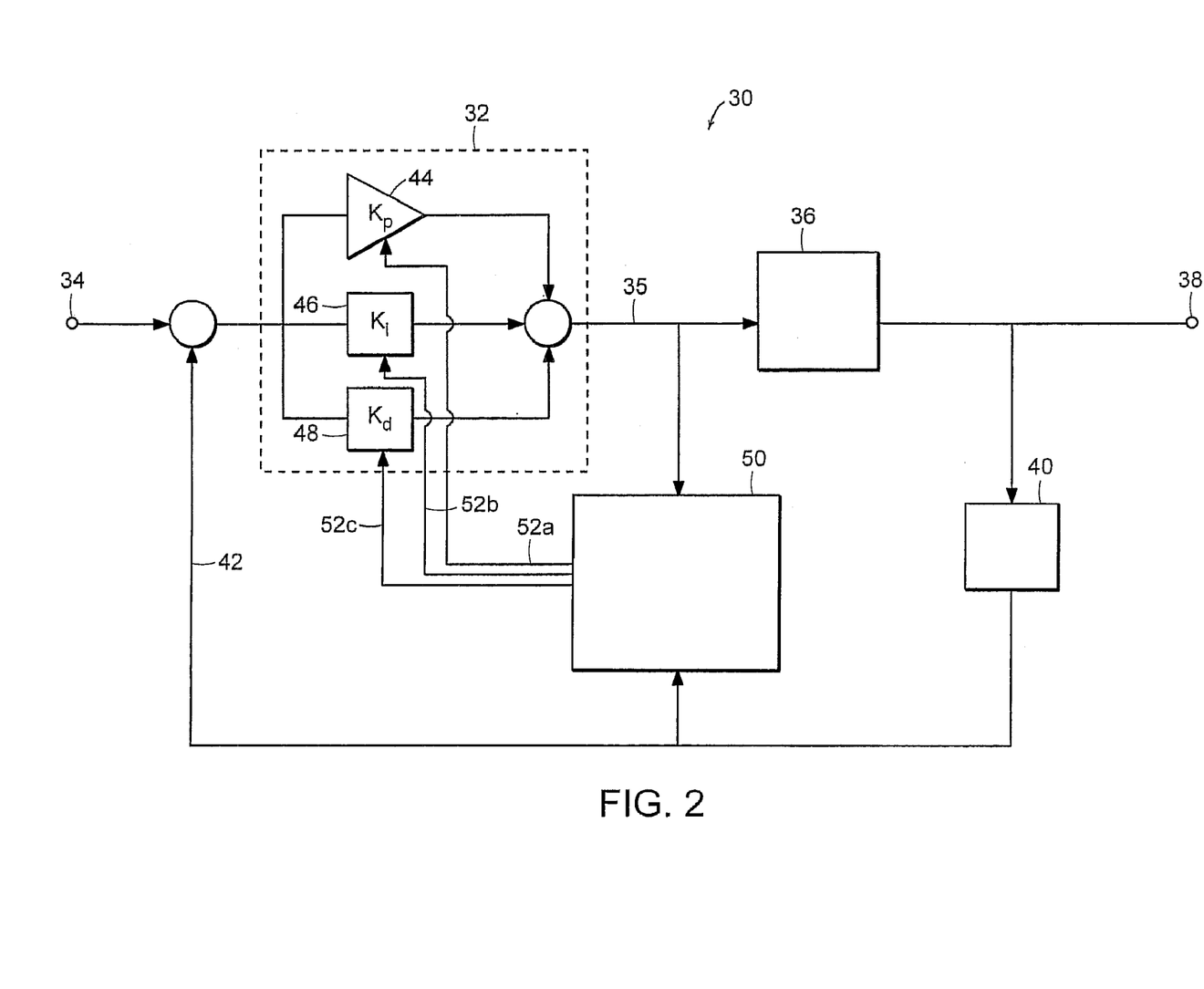
FIG. 2 shows an illustrative diagrammatic functional view of a limited rotation motor and control system in accordance with an embodiment of the invention.

FIG. 2 shows an illustrative diagrammatic view of a system 30 in accordance with an embodiment of the invention. The system 30 includes a PID controller 32 that receives an input command 34. The controller 32 provides a control signal 35 to a motor 36, which moves an optical element such as a mirror to provide position changes 38 responsive to the input command 34. The system 30 also includes a position detector 40 that provides a position detection signal 42 that is also provided to the controller 42 with the input command 34. The controller 32 includes proportional amplifier 44 ($k_p$), a integrating element 46 ($k_i$), and a derivative element 48 ($k_d$). The system also includes a PID adjustment unit 50 that receives the motor control signal that is provided by the controller 32 and the position detection signal 42. The motor control signal and the position detection signal are provided in digital form to a FFT converter within the adjustment unit 50 to determine the closed loop frequency responses, and the open loop frequency response is derived from the closed loop frequency response.

Figure 3A:
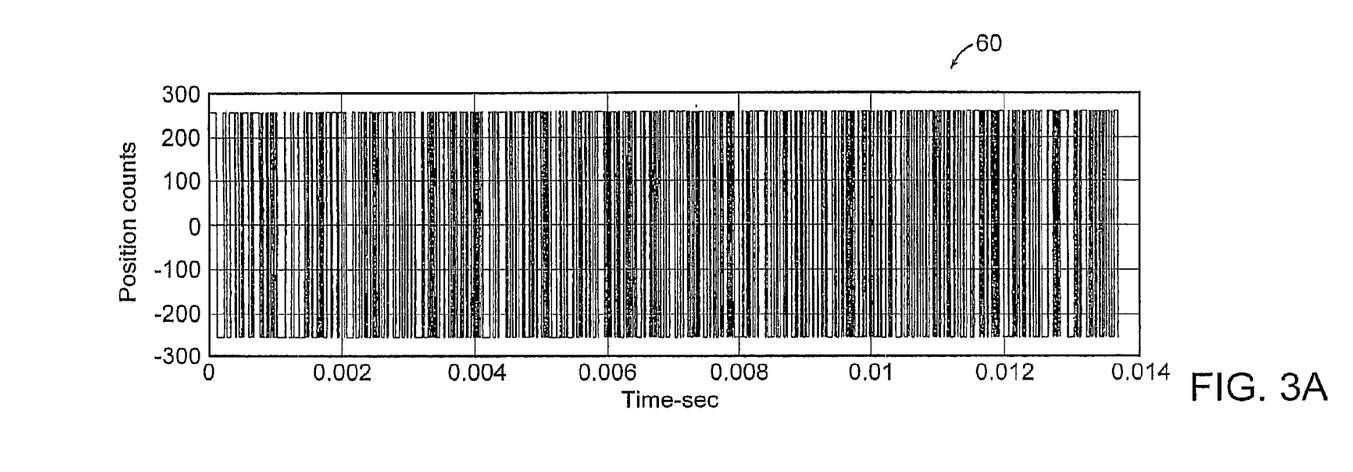
FIGS. 3A and 3B show illustrative graphical representations of a pseudo random binary sequence position signal that is provided to a motor controller, and the associated position detection signal that is produced by the motor in response to the pseudo random binary sequence.
Figure 3B:
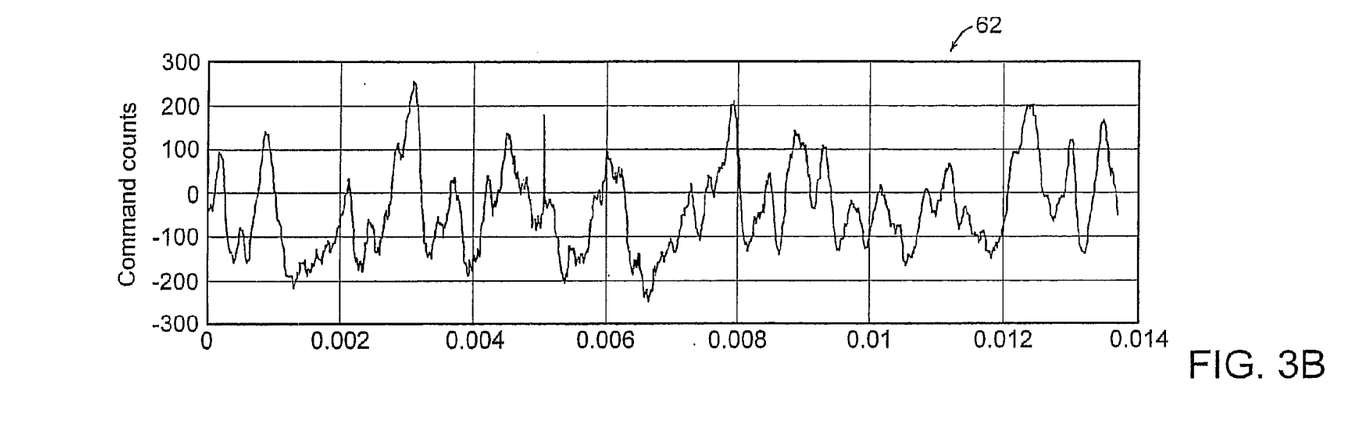

In particular, a pseudo random binary sequence is input to the system either as the input command 34 or is provided as a perturbation to the output of the controller 32. The data points for the PRBS excitation signal may be powers of twos. FIG. 3A shows at 60 a PRBS signal, and FIG. 3B shows at 62 a position detection provided by the motor in response to the PRBS signal shown in FIG. 3A. The input process may capture, for example, 1024 data points for each input signal.

Figure 4:
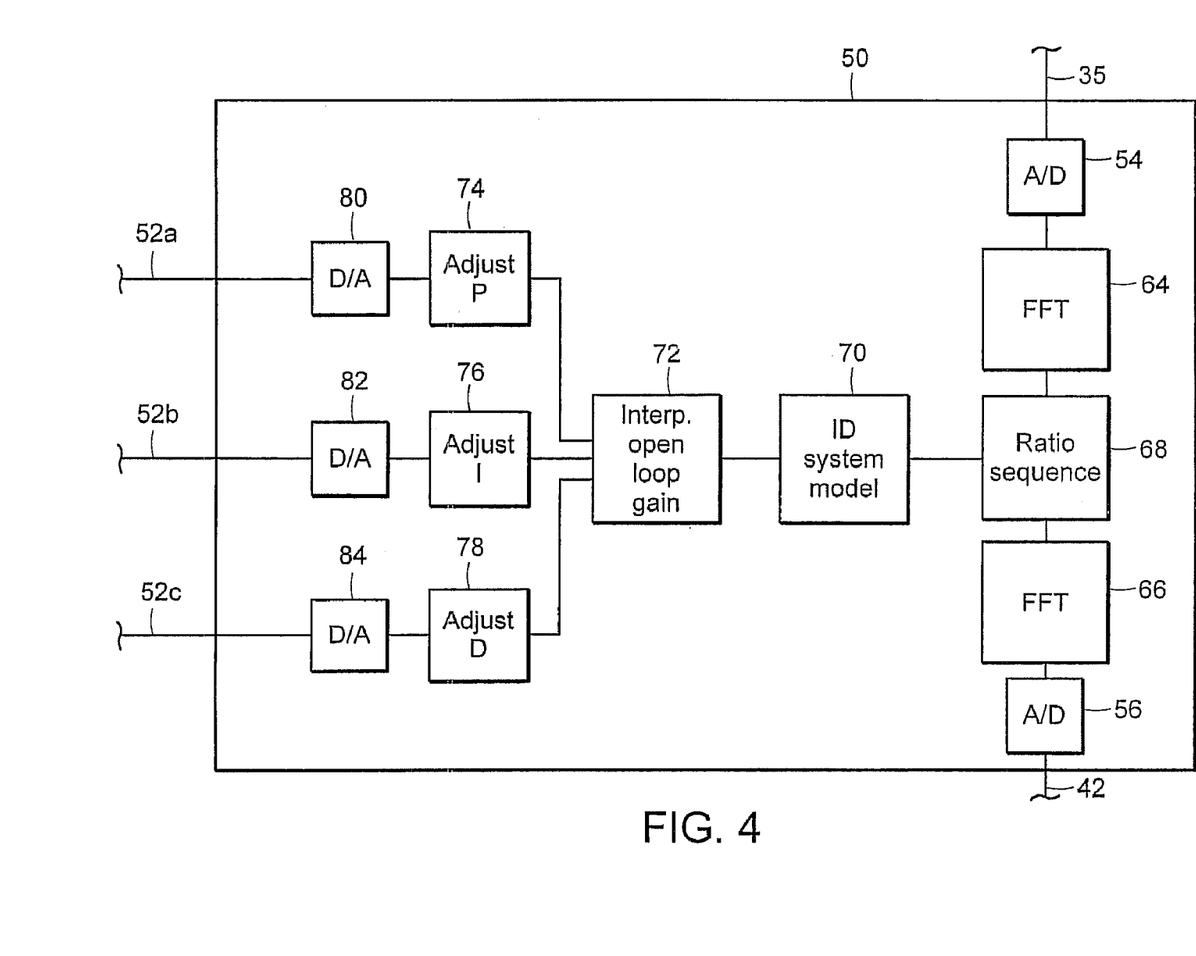
FIG. 4 shows an illustrative diagrammatic representation of a controller in accordance with an embodiment of the invention.
Figure 5:
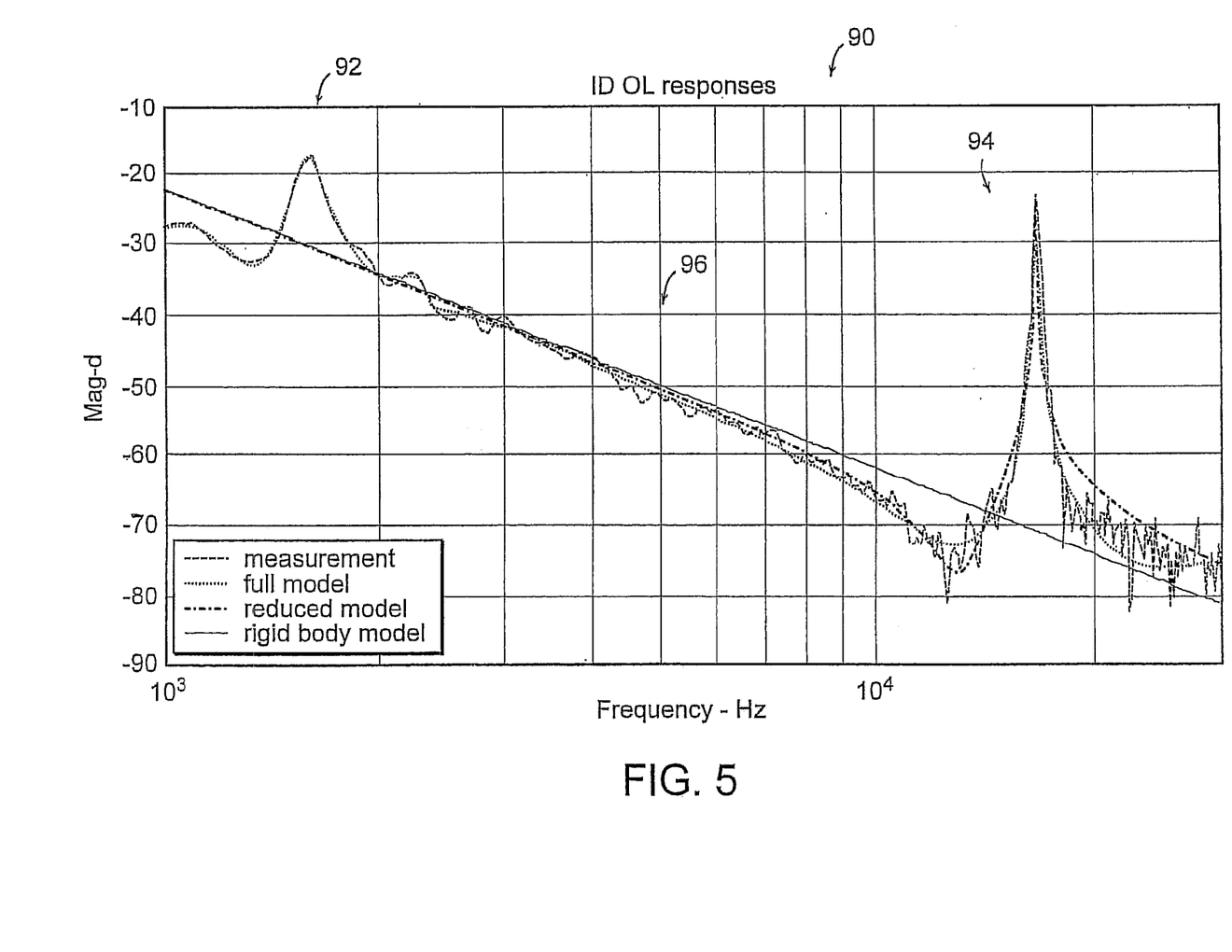
FIG. 5 shows an illustrative graphical representation of a measured frequency response of a system in accordance with an embodiment of the invention.

As shown in FIG. 4, the captured control signal 35 and position detection signal 42 may be converted to digital signals by A/D converters 54 and 56 is either signal is not already in digital form. Once the input signals are in digital form, they may be transmitted any distance, for example, via a network, and the output PID adjustment signals may also be transmitted via a network in a digital environment. The digital input time domain signals are then converted to frequency domain representations of the signals by FFT converter units 64 and 66 respectively. Each FFT provides a complex polynomial of the form $a_0 w_0, a_1 w_1, a_2 w_2 \ldots a_n w_n$, where n may, for example, be 512. A sequence of the ratios of the values $a_0, a_1, a_2 \ldots a_n$ for the position detection signal 42 over the respective values $a_0, a_1, a_2 \ldots a_n$ for the control signal yields a sequence of magnitudes $m_0, m_1, m_2 \ldots m_n$. This ratio sequence is provided by the ratio sequence unit 68. These magnitudes $m_0, m_1, m_2 \ldots m_n$ provide the open loop frequency responses for the system and may be plotted in graphical form as shown at 90 in FIG. 5. As shown in FIG. 5, the system may experience some distortion at low frequencies 92, some harmonic resonance at high frequencies 94, and may be operated in the mid frequency range 96. The data collection procedure may require very little time, for example 13.44 μsec for a 1024 PBRS sequence.

Having determined the open loop frequency responses, the system may then identify a model for the system (using identification unit 70), then interpolate the open loop gain from the identified model (at interpolation unit 72) and then adjust the controller gain accordingly using the proportional adjust unit 74, the integral adjust unit 76 and the derivative adjust unit 78. The outputs of the adjust units 74, 76 and 78 may be provided to D/A converters 80, 82 and 84 respectively, and these analog PID outputs 52a, 52b and 52c may be provided to the PID units 44, 46 and 48 of the controller 32.

Figure 6:
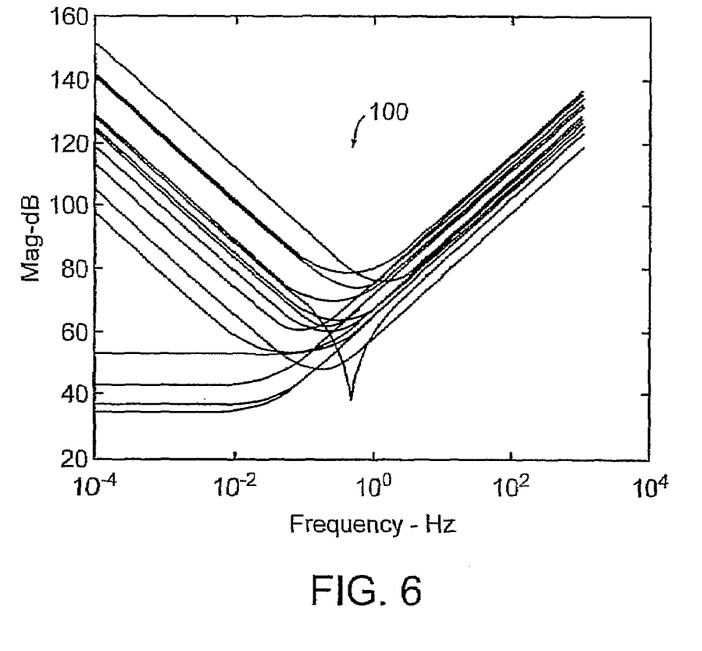
FIG. 6 shows illustrative graphical representations of magnitude response curves of various PID controllers that may be employed in accordance with certain embodiments of the invention.
Figure 7:
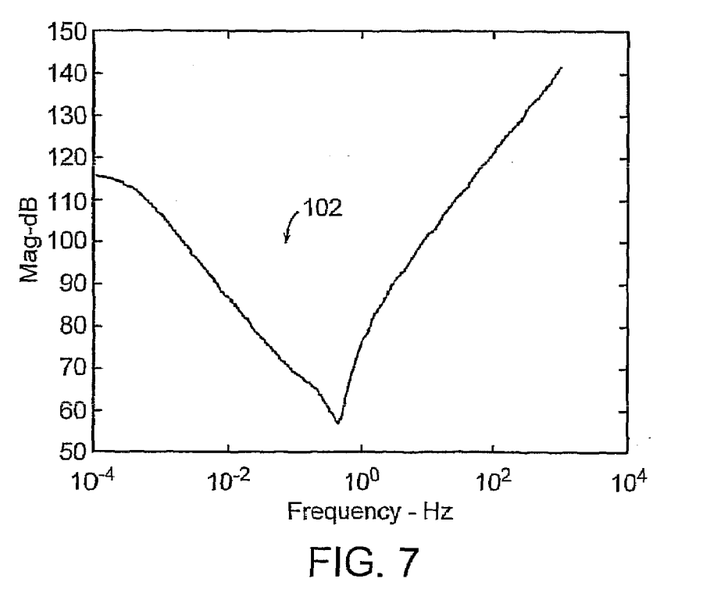
FIG. 7 shows an illustrative graphical representation of a motor transfer function in a system to be controlled in accordance with an embodiment of the invention.

The system model may be identified in a variety of ways, including for example, frequency matching using stored information regarding a plurality of frequency curves for known systems. For example, FIG. 6 shows examples of magnitude response curves 100 for various PID controllers. When a system model has been developed, the best fit frequency curve may be selected. For example, FIG. 7 shows at 102 a model for a controller over a desired range having the transfer function $$\frac{-s^4 - 3.085s^3 - 10.47s^2 - 15.82s - 6.642}{0.3259s^3 + 2.942s^2 + 2.951s - 0.0067}$$

Figure 8:
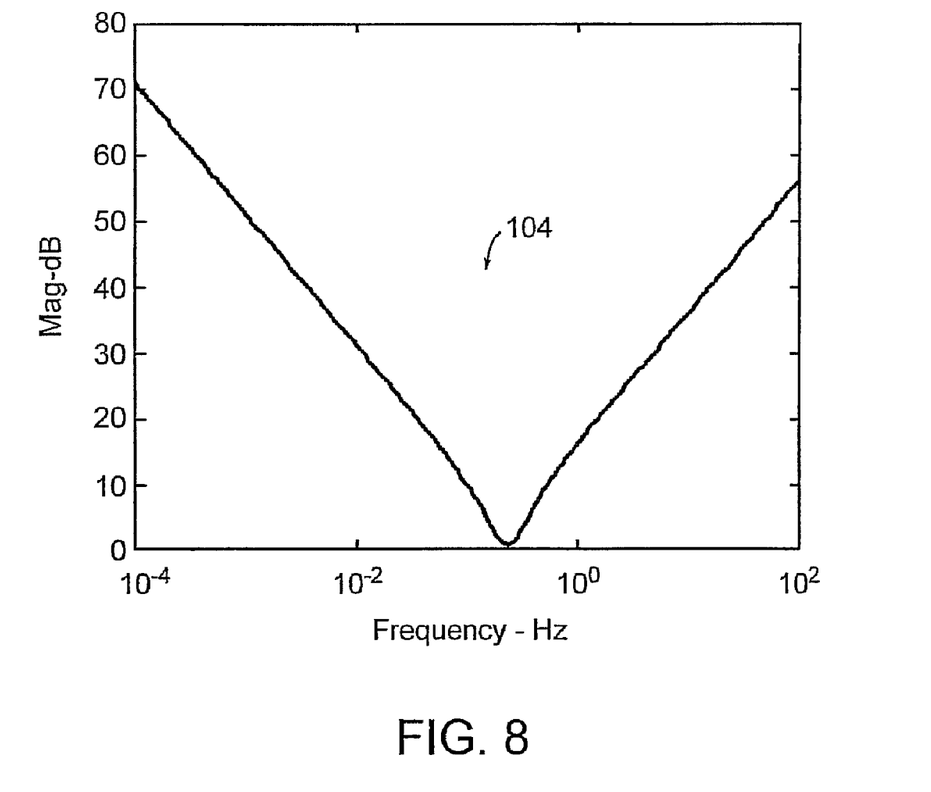
FIG. 8 shows an illustrative graphical representation of a control system transfer function of a system in accordance with an embodiment of the invention.

Using a best fit analysis, the closest matching frequency curve (from 100) may be chosen, and the controller P, I and D values may be adjusted accordingly. For example, FIG. 8 shows at 104 a fitted PID controller with $k_p=1.05$, $k_d=1$ and $k_i=2.25$, with the transfer function of $$\frac{s^2 + 1.05s + 2.25}{s}$$

The system, therefore, first provides a higher order controller that meets the design specifications, and then identifies a PID controller that matches the frequency response of the high order controller. Examples of matching criteria include (1) identifying the PID parameters so that the differences between magnitudes of the frequency responses of the optimal controller and that of the PID controller is minimized in the least mean square (LMS) sense, and (2) identifying the PID parameters so that the distance on the s-plane between magnitudes of the frequency responses of the optimal controller and that of the PID controller is minimized in the LMS sense. Frequency weighting functions may be used for each of the above. In further embodiments, other identification methods may involve linear least square with weighting, non-linear search with weighting, and linear least square followed by non-linear search, each with weighting.

The objective, therefore, of frequency matching is to select the appropriate controller coefficients for a given controller architecture so that the difference between the frequency responses C(w) and D(w) is minimized, where C(w) is the controller to be designed, D(w) is the desired controller and w is the frequency variable in radians/sec. For optimization methods employing LMS, this is equivalent to minimizing the following $$Q = \sqrt{\sum [(\text{real}(C(w)) - \text{real}(D(w))^2 + (\text{image}(C(w)) - \text{image}(D(w))^2]}$$

where real( ) and image( ) represent the real and imaginary part of the frequency responses respectively. For a linear time-invariant minimal phase system, the phase of the frequency response is uniquely defined by the magnitude of the frequency response. The equivalent function may be defined as $$Q = \sqrt{\sum_{\text{for all } w \text{ of interest}} [(\text{mag}(C(w)) - \text{mag}(D(w)))^2]}$$

and $$Q = \sqrt{\sum_{\text{for all } w \text{ of interest}} [(\text{ang}(C(w)) - \text{ang}(D(w)))^2]}$$

where mag( ) and ang( ) represent the magnitude and phase angle of the frequency responses respectively. When the frequency responses at certain frequencies are more significant than at other frequencies, the desired frequency response D(w) may be replaced by D(w)*W(w) in the above functions where W(w) is the weighting function. For example, if the weighting of all other frequencies are 1 in the weighting function W(w), the value of 10 may be assigned to frequencies that are more critical. This provides a weighted LMS method.

For a PID controller as shown in FIG. 2, therefore, the frequency response may be generalized as $$C(w) = (k_d * jw + k_i - k_p * w^2)/jw$$

where $k_p$, $k_i$ and $k_d$ are the gains of the proportional, integral and derivative of the error respectively. These three coefficients fully define the PID controller and may be designed by substituting the above equation for C(w) into the functions discussed above for Q.

Figure 9:
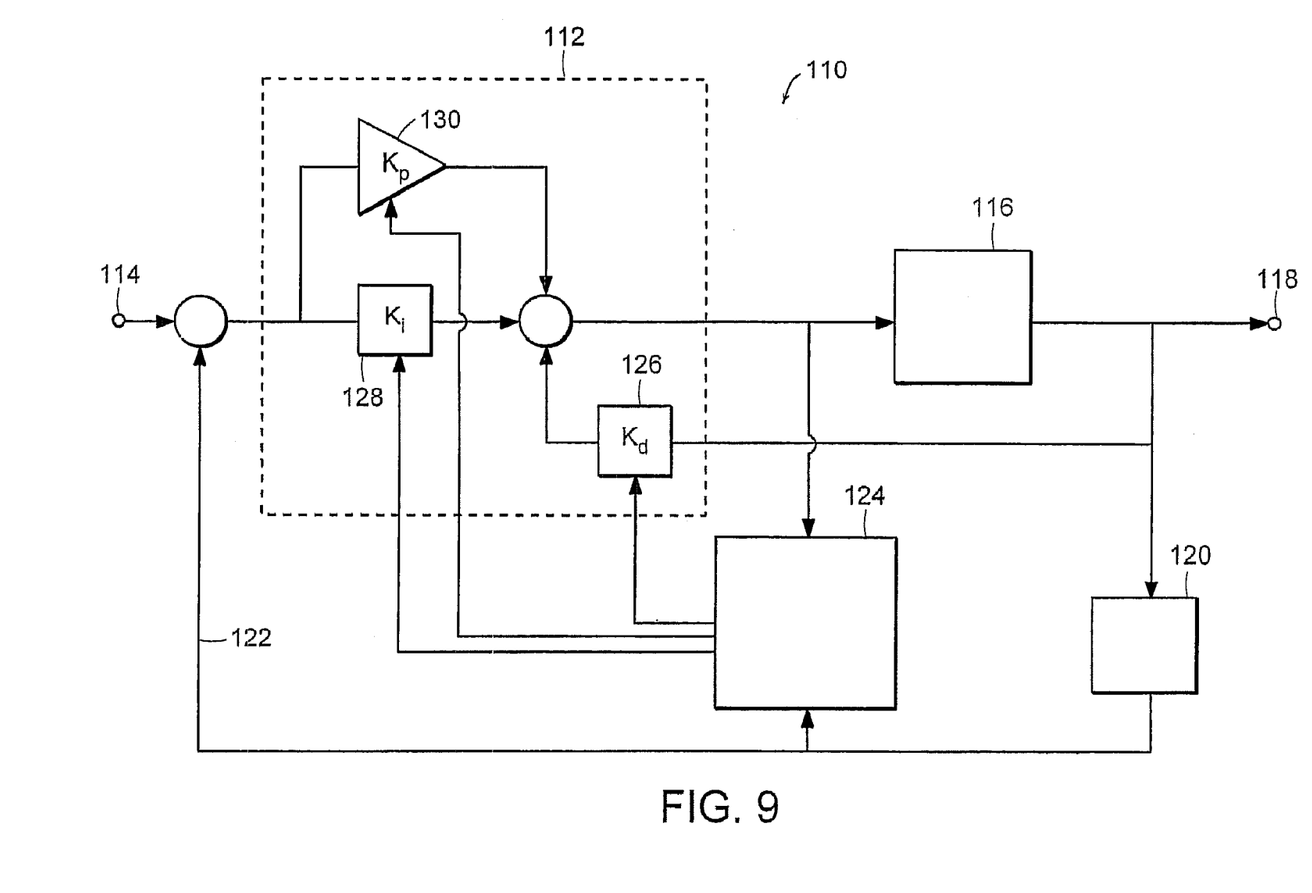
FIG. 9 shows an illustrative diagrammatic functional view of a galvanometer and control system in accordance with another embodiment of the invention.

As shown in FIG. 9, a PI plus D controller system 110 in accordance with a further embodiment of the invention may include a PID controller 112 that receives an input command 114. The controller 112 provides a control signal to a motor 116, which moves an optical element such as a mirror to provide position changes 118 responsive to the input command 114. The system also includes a position detector 120 that provides a position detection signal 122 that is also provided to the controller 112 with the input command 114. The system also includes a PID adjustment unit 124 the receives the motor control signal and the position detection signal, and provide output adjustment signals to the proportional amplifier 126 ($k_p$), the integral unit 128 ($k_i$) and the derivative unit 130 ($k_d$).

Instead of feeding back the derivative of the error signal as with the PID controller discussed above, the PI plus D controller provides feedback of the derivative of the velocity signal only. The frequency response of the PI plus D controller therefore is $$C(w)=(k_p*jw+k_i)/jw*(1+k_d*jw*P(w))$$

where P(w) is the frequency response of the system to be controlled. Again, the controller coefficients $k_p$, $k_i$, $k_d$ may be designed using frequency matching by substituting the above equation for C(w) into the functions for Q discussed above.

Figure 10:
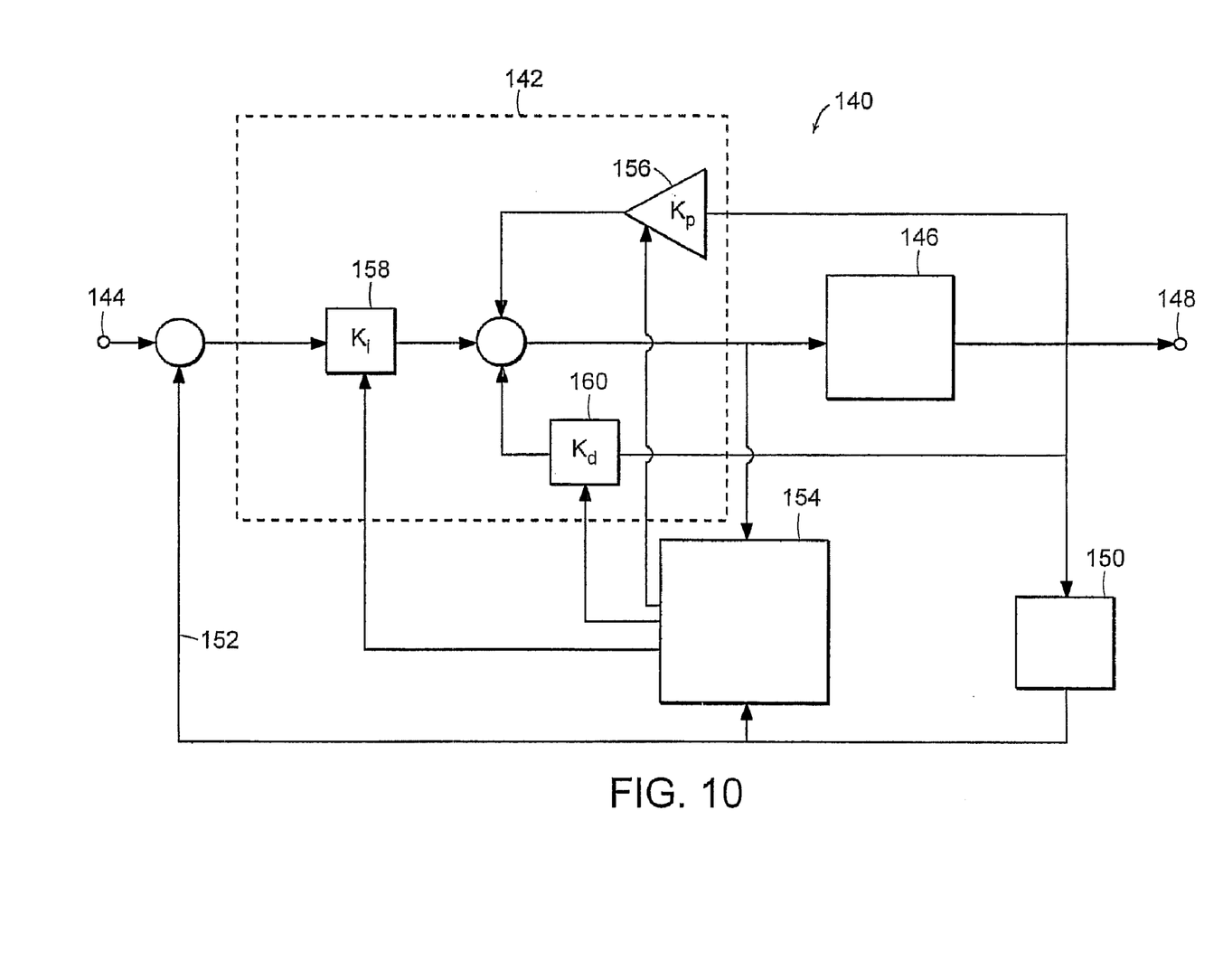
FIG. 10 shows an illustrative diagrammatic functional view of a galvanometer and control system in accordance with a further embodiment of the invention.

As shown in FIG. 10, a P plus I plus D controller system 140 in accordance with a further embodiment of the invention may include a PID controller 142 that receives an input command 144. The controller 142 provides a control signal to a motor 146, which moves an optical element such as a mirror to provide position changes 148 responsive to the input command 144. The system also includes a position detector 150 that provides a position detection signal 152 that is also provided to the controller 142 with the input command 144. The system also includes a PID adjustment unit 154 the receives the motor control signal and the position detection signal, and provide output adjustment signals to the proportional amplifier 156 ($k_p$), the integral unit 158 ($k_i$) and the derivative unit 160 ($k_d$).

The error proportional term in the PI plus D controller is therefore replaced with the position proportional term. The frequency response of the P plus I plus D controller therefore is $$C(w)=(k_i)/jw*(1+(k_d*jw+k_p)*P(w))$$

where P(w) is the frequency response of the system to be controlled. Again, the controller coefficients $k_p$, $k_i$, $k_d$ may be designed using frequency matching by substituting the above equation for C(w) into the functions for Q discussed above.

Figure 11A:
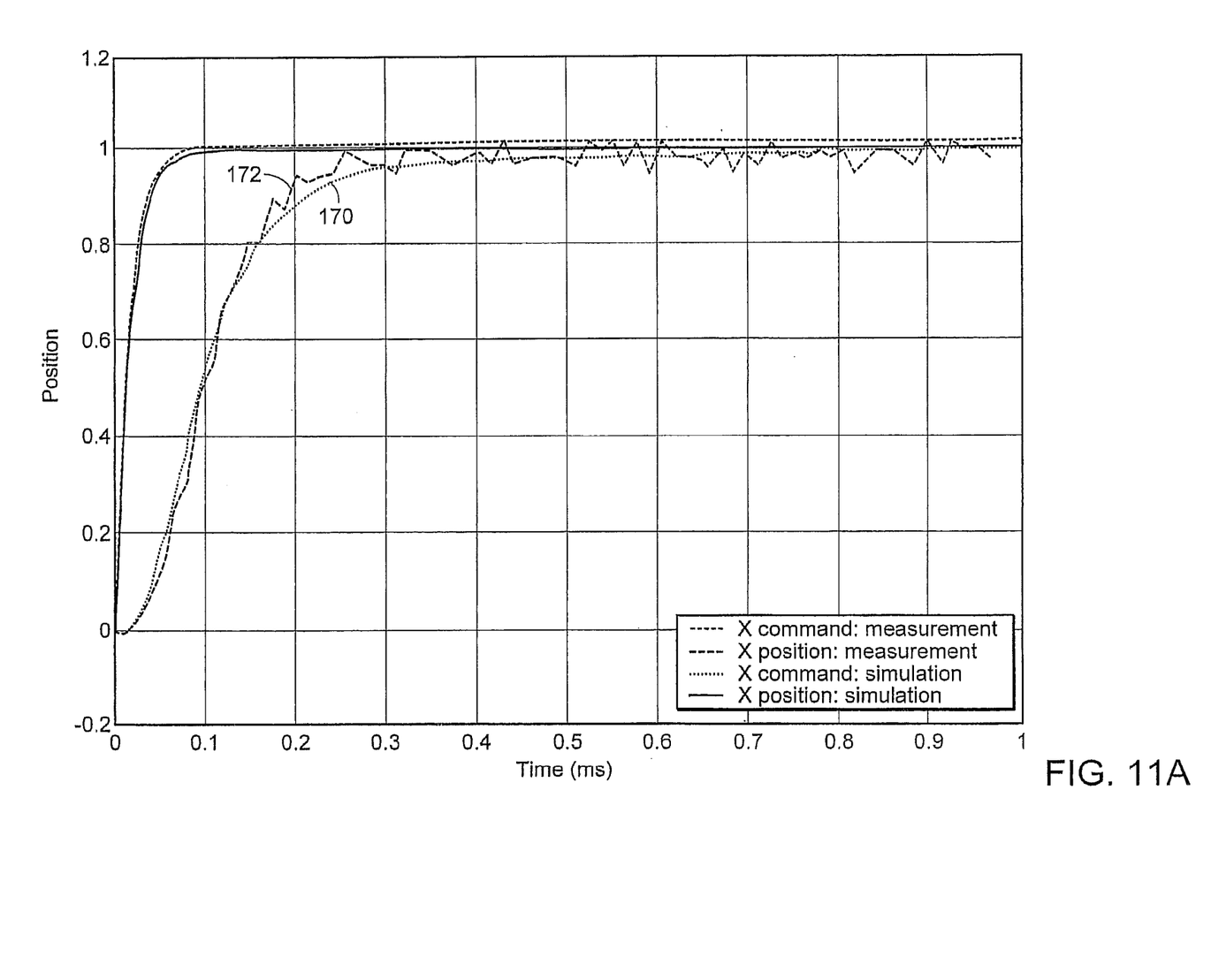
FIGS. 11A and 11B show illustrative graphical representations of step response signals in a control system with and without employing a tuning system in accordance with an embodiment of the invention.
Figure 11B:
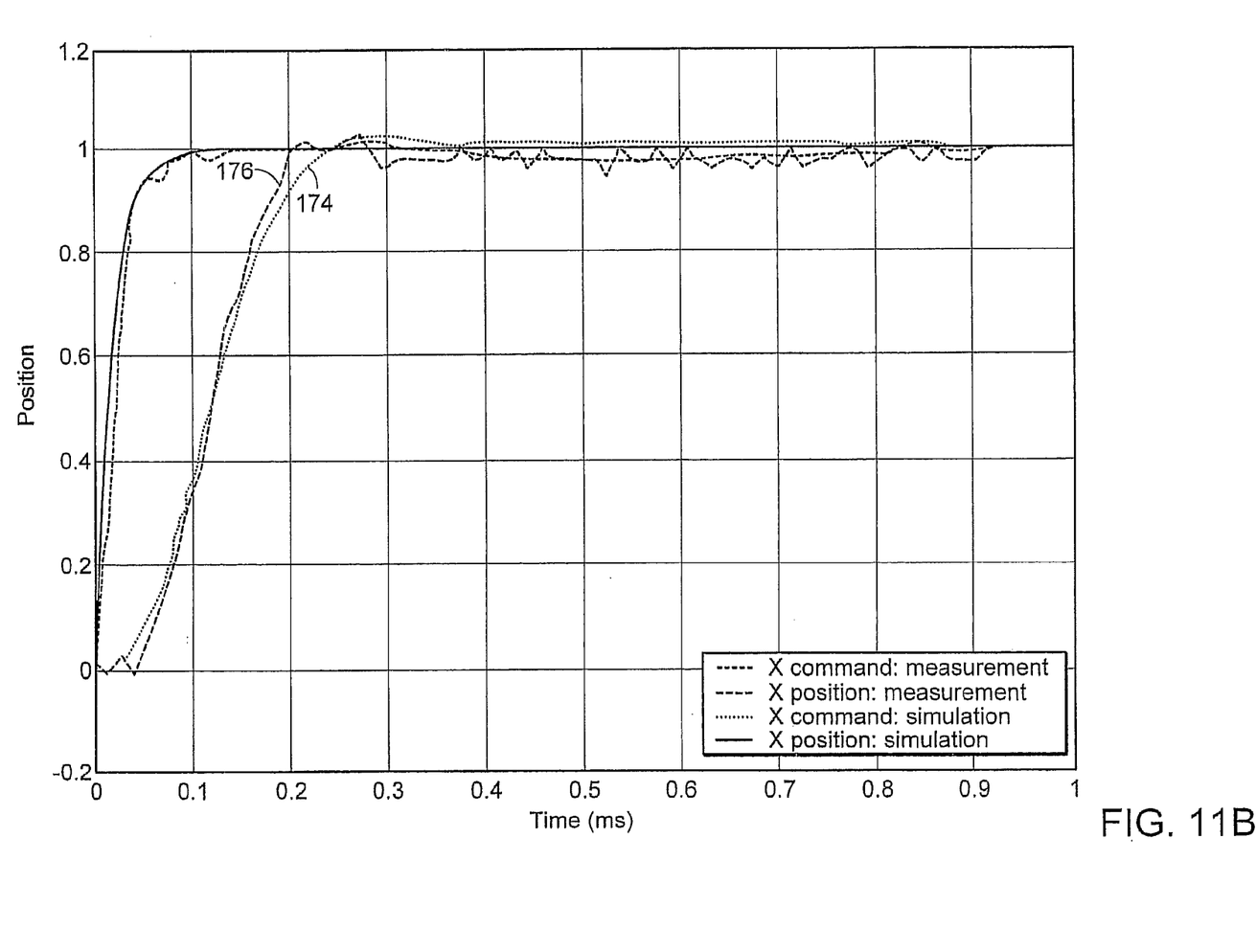

The invention provides, therefore, that a PID controlled limited rotation motor system may be adjusted to provide improved performance by adjusting the coefficients for the proportional, integral and derivative elements of the PID controller. FIG. 11A shows a command measurement 170 and a corresponding position measurement 172 for a PID controller system prior to performing an adjustment in accordance with an embodiment, and FIG. 11B shows a command measurement 174 and a corresponding position measurement 176 for a the PID controller system after an adjustment is made to the PID coefficients in accordance with an embodiment of the invention.

Those skilled in the art will appreciate that numerous modifications and variations may be made to the above disclosed embodiments without departing from the spirit and scope of the invention.

What is claimed is:

1. An adjustment system for adjusting a proportional, integral, derivative (PID) controller in a limited rotation motor system, said adjustment system comprising:

first transform means for receiving a first digital signal that is representative of a motor control signal, and for providing a first frequency domain sequence that is representative of a frequency domain representation of the motor control signal;

second transform means for receiving a second digital signal that is representative of a position detection signal, and for providing a second frequency domain sequence that is representative of a frequency domain representation of the position detection signal;

model identification means for identifying a representation of a ratio of the first and second frequency domain sequences; and PID adjustment means for identifying appropriate values for the coefficient $k_p$ of a proportional unit of the system, for the coefficient $k_i$ of an integral unit for the system, and for the coefficient $k_d$ of a derivative unit for the system responsive to the ratio of the first and second frequency domain sequences.

2. The system as claimed in claim 1, wherein said first transform means and said second transform means each perform a Fast Fourier Transform.

3. The system as claimed in claim 1, wherein said adjustment means is coupled to the proportional, integral, derivative controller via a digital network.

4. The system as claimed in claim 1, wherein said model identification means includes best fit analysis means for identifying a known frequency response that most closely matches the ratio of the first and second frequency domain sequences.

5. The system as claimed in claim 1, wherein the ratio of the first and second frequency domain sequences is provided by the second frequency domain sequence divided by the first frequency domain sequence.

6. The system as claimed in claim 1, wherein the proportional, integral, derivative controller is a PI plus D controller.

7. The system as claimed in claim 1, wherein the proportional, integral, derivative controller is a P plus I plus D controller.

8. The system as claimed in claim 1, wherein said proportional, integral, derivative controller is employed in a limited rotation motor system.

9. A proportional, integral, derivative (PID) controller including a proportional unit, an integral unit, and a derivative unit, said controller comprising:

first transform means for receiving a first digital signal that is representative of a motor control signal, and for providing a first frequency domain sequence that is representative of a frequency domain representation of the motor control signal;

second transform means for receiving a second digital signal that is representative of a position detection signal, and for providing a second frequency domain sequence that is representative of a frequency domain representation of the position detection signal;

model identification means for identifying a representation of a ratio of the first and second frequency domain sequences; and PID adjustment means for identifying appropriate values for the coefficient $k_p$ of the proportional unit of the system, for the coefficient $k_i$ of the integral unit for the system, and for the coefficient $k_d$ of the derivative unit for the system responsive to the ratio of the first and second frequency domain sequences.

10. The system as claimed in claim 9, wherein said PID adjustment means is coupled to the proportional, integral, derivative controller via a digital network.

11. The system as claimed in claim 9, wherein said model identification means includes best fit analysis means for identifying a known frequency response that most closely matches the ratio of the first and second frequency domain sequences.

12. The system as claimed in claim 9, wherein the ratio of the first and second frequency domain sequences is provided by the second frequency domain sequence divided by the first frequency domain sequence.

13. The system as claimed in claim 9, wherein the proportional, integral, derivative controller is a PI plus D controller.

14. The system as claimed in claim 9, wherein the proportional, integral, derivative controller is a P plus I plus D controller.

15. The system as claimed in claim 9, wherein said proportional, integral, derivative controller is employed in a limited rotation motor system.

16. A proportional, integral, derivative (PID) controller system including a first controller for controlling an x axis limited rotation motor, and a second controller for controlling a y axis limited rotation motor, each of said first and second controllers comprising:
  first transform means for receiving a first digital signal that is representative of a motor control signal, and for providing a first frequency domain sequence that is representative of a frequency domain representation of the motor control signal;
  second transform means for receiving a second digital signal that is representative of a position detection signal, and for providing a second frequency domain sequence that is representative of a frequency domain representation of the position detection signal;
  model identification means for identifying a representation of a ratio of the first and second frequency domain sequences; and
  PID adjustment means for identifying appropriate values for the coefficient $k_p$ of a proportional unit of the system, for the coefficient $k_i$ of the integral unit for the system, and for the coefficient $k_d$ of a derivative unit for the system responsive to the ratio of the first and second frequency domain sequences.

17. The system as claimed in claim 16, wherein said PID adjustment means is coupled to the proportional, integral, derivative controller via a digital network.

18. The system as claimed in claim 16, wherein said model identification means includes best fit analysis means for identifying a known frequency response that most closely matches the ratio of the first and second frequency domain sequences.

19. The system as claimed in claim 16, wherein the ratio of the first and second frequency domain sequences is provided by the second frequency domain sequence divided by the first frequency domain sequence.

20. The system as claimed in claim 16, wherein said proportional, integral, derivative controller system is employed in a limited rotation motor system.

* * * * *